(12) United States Patent
Lee et al.

(10) Patent No.: US 11,735,539 B2
(45) Date of Patent: Aug. 22, 2023

(54) SEMICONDUCTOR DEVICE AND METHOD OF FORMING DISCRETE ANTENNA MODULES

(71) Applicant: STATS ChipPAC Pte. Ltd., Singapore (SG)

(72) Inventors: HunTeak Lee, Gyeongi-do (KR); Choon Heung Lee, Seoul (KR); JunHo Ye, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 200 days.

(21) Appl. No.: 17/092,449

(22) Filed: Nov. 9, 2020

(65) Prior Publication Data

US 2022/0148983 A1 May 12, 2022

(51) Int. Cl.
| | |
|---|---|
| *H01L 23/66* | (2006.01) |
| *H01L 23/31* | (2006.01) |
| *H01L 23/538* | (2006.01) |
| *H01L 21/48* | (2006.01) |
| *H01L 21/56* | (2006.01) |
| *H01Q 1/22* | (2006.01) |
| *H01L 23/552* | (2006.01) |

(52) U.S. Cl.
CPC .......... *H01L 23/66* (2013.01); *H01L 21/4853* (2013.01); *H01L 21/565* (2013.01); *H01L 23/3121* (2013.01); *H01L 23/5386* (2013.01); *H01L 23/552* (2013.01); *H01Q 1/2283* (2013.01); *H01L 2223/6677* (2013.01)

(58) Field of Classification Search
CPC . H01L 23/66; H01L 23/3121; H01L 23/5386; H01L 23/552; H01L 21/4853; H01L 21/565; H01L 2223/6677; H01Q 1/2283; H01Q 1/526; H01Q 3/24; H01Q 9/0414
See application file for complete search history.

(56) References Cited

U.S. PATENT DOCUMENTS

| | | | |
|---|---|---|---|
| 10,097,231 B1* | 10/2018 | Liu | .......................... H04B 7/04 |
| 10,547,119 B2 | 1/2020 | Kim et al. | |
| 10,566,298 B2* | 2/2020 | Dalmia | .................. H01L 23/66 |
| 2019/0051989 A1 | 2/2019 | Kim et al. | |

(Continued)

*Primary Examiner* — Kyoung Lee
*Assistant Examiner* — Christina A Sylvia
(74) *Attorney, Agent, or Firm* — Robert D. Atkins; Patent Law Group: Atkins and Associates, P.C.

(57) ABSTRACT

A semiconductor device has an electronic component assembly, and a plurality of discrete antenna modules disposed over the electronic component assembly. Each discrete antenna module is capable of providing RF communication for the electronic component assembly. RF communication can be enabled for a first one of the discrete antenna modules, while RF communication is disabled for a second one of the discrete antenna modules. Alternatively, RF communication is enabled for the second one of the discrete antenna modules, while RF communication is disabled for the first one of the discrete antenna modules. A bump is formed over the discrete antenna modules. An encapsulant is deposited around the discrete antenna modules. A shielding layer is formed over the electronic components assembly. A stud or core ball can be formed internal to a bump connecting the discrete antenna modules to the electronic component assembly.

17 Claims, 13 Drawing Sheets

(56) References Cited

U.S. PATENT DOCUMENTS

2019/0173184 A1    6/2019  Kim et al.
2019/0280374 A1*   9/2019  Kim .................... H01L 23/5383
2021/0091017 A1*   3/2021  Yeon ................... H01L 23/552

* cited by examiner

US 11,735,539 B2

SEMICONDUCTOR DEVICE AND METHOD OF FORMING DISCRETE ANTENNA MODULES

FIELD OF THE INVENTION

The present invention relates in general to semiconductor devices and, more particularly, to a semiconductor device and method of disposing a plurality of discrete antenna modules over electrical components in a system-in-package module.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into a system-in-package (SIP) module for higher density in a small space and extended electrical functionality. Within the SIP module, semiconductor die and IPDs are mounted to a substrate for structural support and electrical interconnect. An encapsulant is deposited over the semiconductor die, IPDs, and substrate. An antenna is needed to transmit and receive RF signals for the IPDs. A single integrated antenna substrate is disposed over the entire SIP and electrically connected to the IPDs on the substrate for RF communications. The integrated antenna substrate made by a general build-up method, i.e., conductive layers formed over insulating layers. Unfortunately, if the integrated antenna substrate fails, the entire SIP is considered defective.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
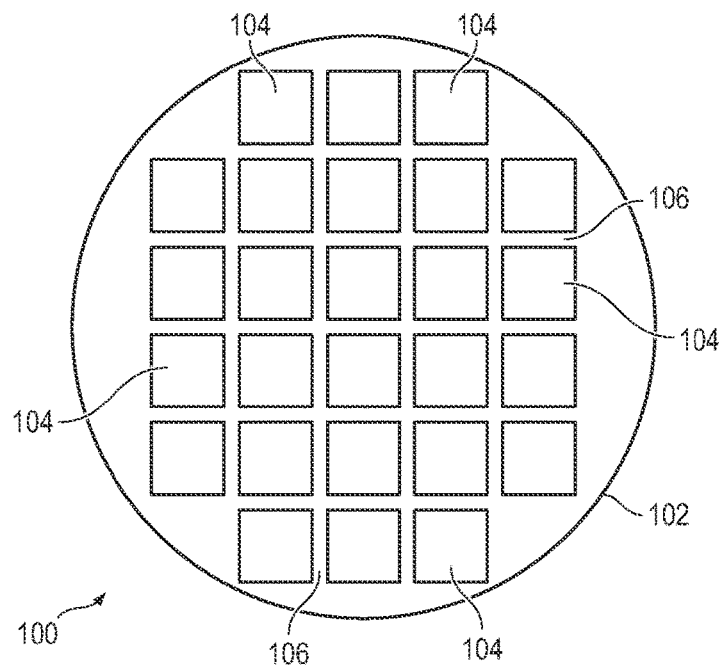
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
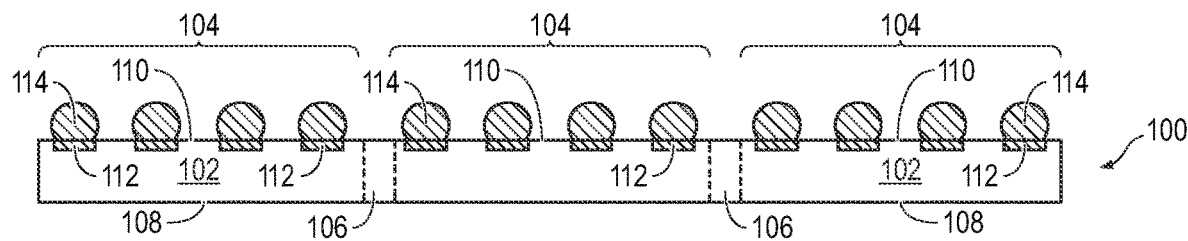

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed overactive surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
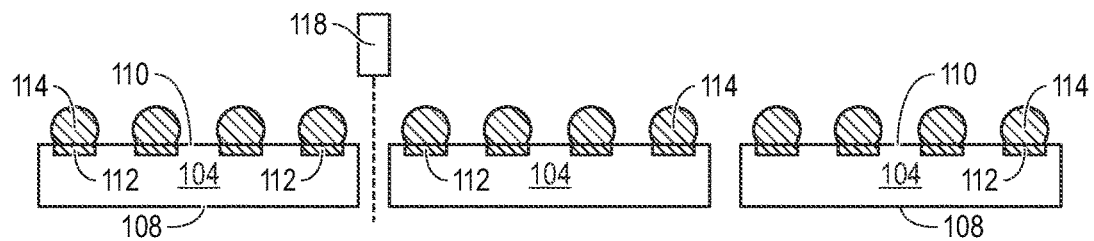

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
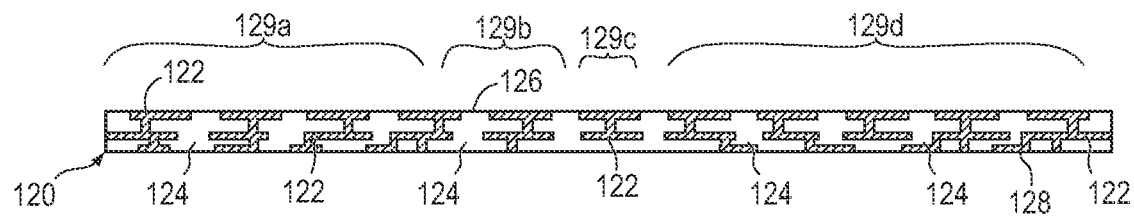
FIGS. 2a-2d illustrate a process of disposing electronic components on a substrate in an SIP.

FIGS. 2a-2d illustrate a process of disposing electrical components over an interconnect substrate to form an SIP module. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
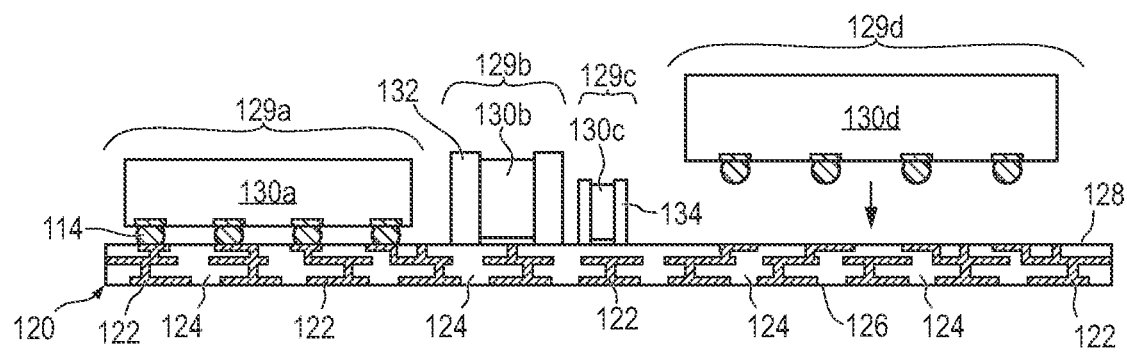
Figure 2C:
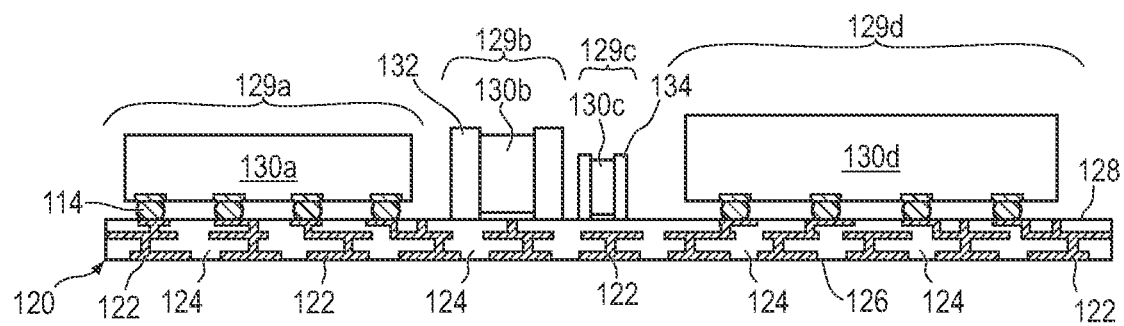

In FIG. 2b, a plurality of electrical components 130a-130d is mounted to surface 128 of interconnect substrate 120 and electrically and mechanically connected to conductive layers 122. Electrical components 130a-130d are each positioned over substrate 120 using a pick and place operation. For example, electrical component 130a can be semiconductor die 104 from FIG. 1c with active surface 110 and bumps 114 oriented toward surface 128 of substrate 120 over component attach area 129a. Alternatively, electrical components 130a-130d can include other semiconductor die, semiconductor packages, surface mount devices, discrete electrical devices, or IPDs, such as a resistor, capacitor, and inductor. Electrical components 130b and 130c use terminals 132 and 134 to make electrical and mechanical connection to conductive layer 122 on interconnect substrate 120. Electrical component 130b has terminals 132 oriented toward surface 128 of substrate 120 over component attach area 129b. Electrical component 130c has terminals 134 oriented toward surface 128 of substrate 120 over component attach area 129c. Electrical component 130d can be another semiconductor die 104 from FIG. 1c, or another type of semiconductor die, with active surface 110 and bumps 114 oriented toward surface 128 of substrate 120 over component attach area 129d. Electrical components 130a-130d are mounted to interconnect substrate 120, as shown in FIG. 2c, with bumps 114 and terminals 132 and 134 making mechanical and electrical connection to conductive layer 122.

Figure 2D:
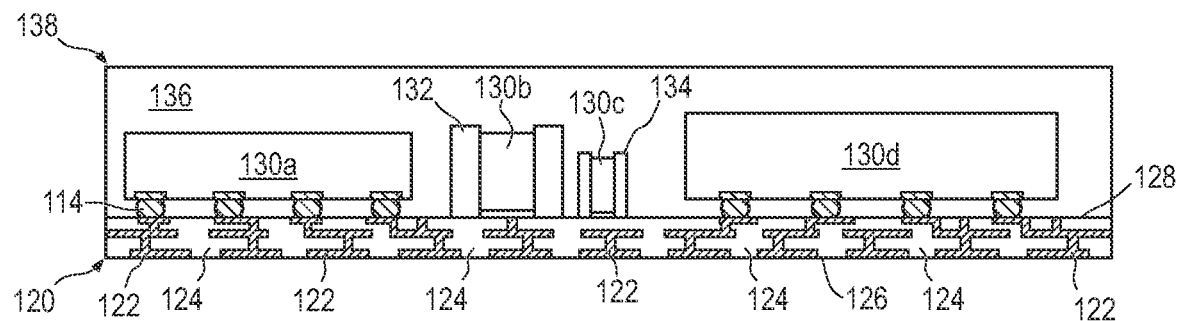

In FIG. 2d, an encapsulant or molding compound 136 is deposited over and around electric components 130a-130d and substrate 120 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive, provides structural support, and environmentally protects the semiconductor device from external elements and contaminants.

Figure 3A:
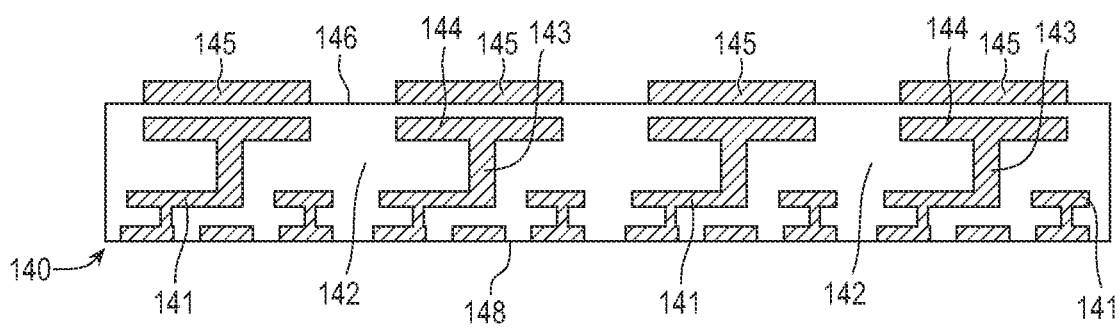
FIGS. 3a-3c illustrate a process of forming discrete antenna modules.
Figure 3B:
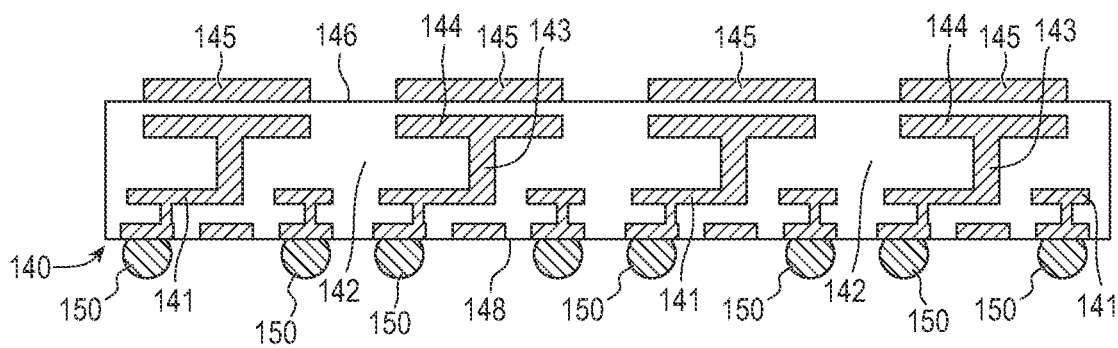
Figure 3C:
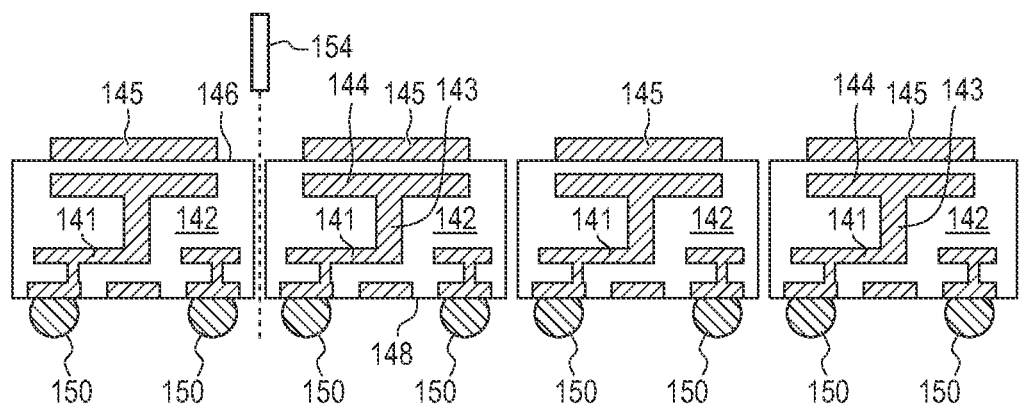

FIGS. 3a-3c illustrate a process of forming discrete antenna modules. FIG. 3a shows a cross-sectional view of integrated antenna substrate 140 including conductive layers 141 and insulating layer 142. Conductive layer 141 can be one or more layers of Al, Cu, Sn, Ni, Au, Ag, or other suitable electrically conductive material. Conductive via 143 is formed through insulating layer 142. Conductive layer 141 and conductive via 143 provides horizontal electrical interconnect across substrate 140 and vertical electrical interconnect between bottom surface 148 and antenna 144 within substrate 140. Portions of conductive layer 141 and conductive via 143 can be electrically common or electrically isolated depending on the design and function of semiconductor die 104 and other electrical components. Insulating layer 142 contains one or more layers of SiO2, Si3N4, SiON, Ta2O5, Al2O3, solder resist, polyimide, BCB, PBO, and other material having similar insulating and structural properties. Insulating layer 142 provides isolation between conductive layers 141 and conductive via 143. Patch antenna 145 is disposed over top surface 146. Antenna 144 and/or patch antenna 145 provide for transmitting and receiving radio frequency (RF) signals for electronic components 30a-130d, i.e., providing RF communications.

In FIG. 3b, an electrically conductive bump material is deposited over conductive layer 141 on bottom surface 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 141 using a suitable attachment or bonding process. In one embodiment, the bump material is reflowed by heating the material above its melting point to form balls or bumps 150. In one embodiment, bump 150 is formed over an UBM having a wetting layer, barrier layer, and adhesive layer. Bump 150 can also be compression bonded or thermocompression bonded to conductive layer 141. Bump 150 represents one type of interconnect structure that can be formed over conductive layer 141. The interconnect structure can also use bond wires, conductive paste, stud bump, micro bump, or other electrical interconnect.

Figure 4:
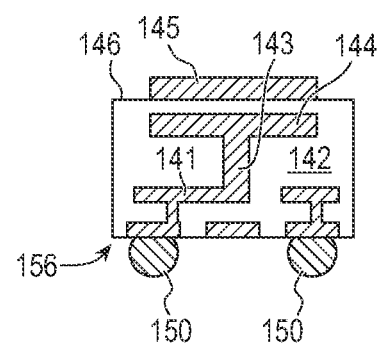
FIG. 4 illustrates the discrete antenna module.

In FIG. 3c, substrate 140 is singulated using a saw blade or laser cutting tool 154 into individual discrete antenna modules 156. FIG. 4 shows one discrete antenna module 156 with antenna 144 and/or patch antenna 145 provide RF communications by transmitting and receiving RF signals. RF signals are received by antenna 144 and/or patch antenna 145 and routed through conductive via 143, conductive layers 141, and bumps 150 to electronic component assembly 138. RF signals are transmitted from electronic component assembly 138 through conductive via 143, conductive layers 141, and bumps 150 and out antenna 144 and/or patch antenna 145.

Figure 5A:
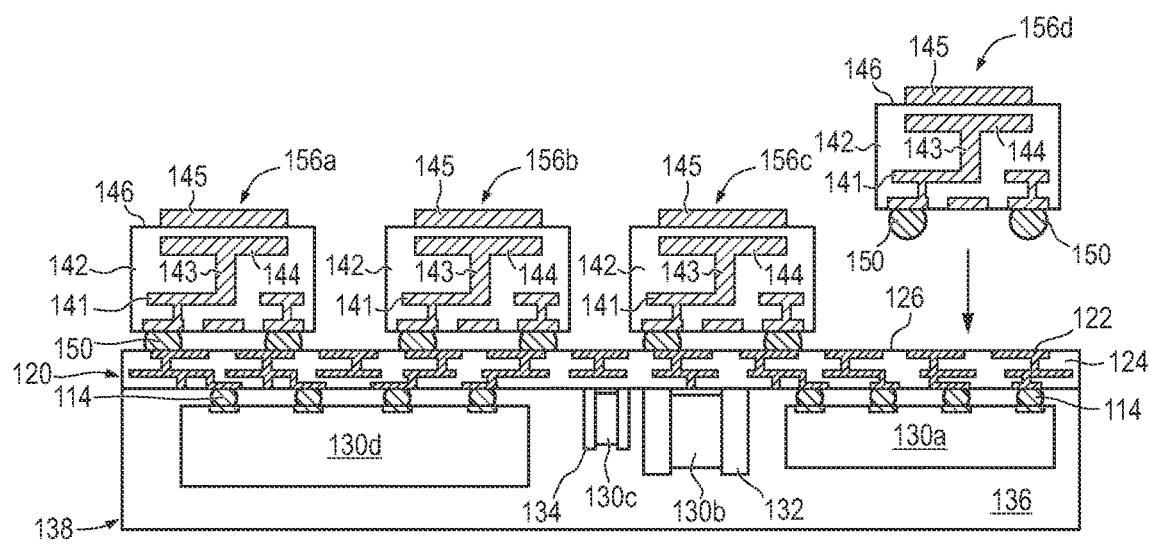
FIGS. 5a-5f illustrate a process of mounting the discrete antenna modules over the electronic components.
Figure 5B:
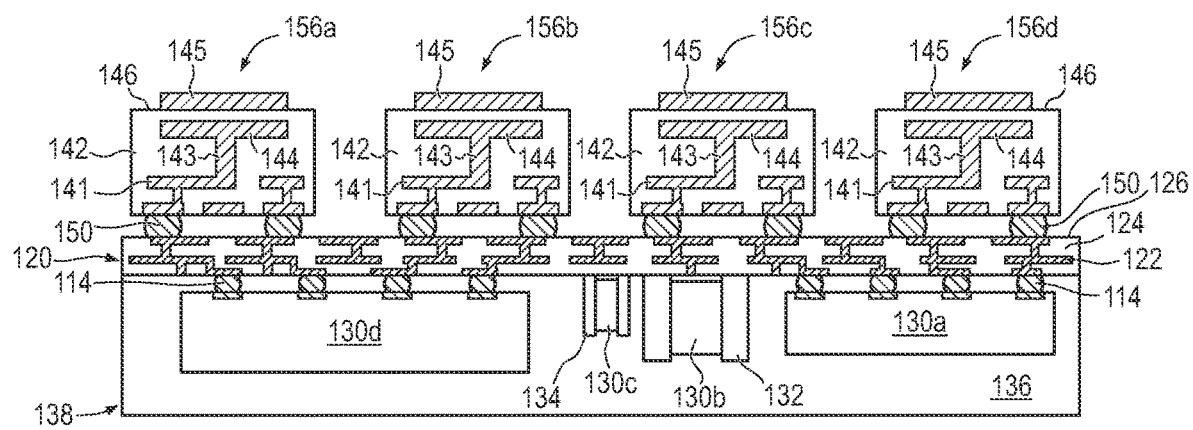

In FIG. 5a, discrete antenna modules 156a-156d from FIG. 4 are positioned over and mounted to surface 126 of interconnect substrate 120 in electronic component assembly 138 from FIG. 2d using a pick and place operation. FIG. 5b shows discrete antenna modules 156a-156d mounted to electronic component assembly 138 with bumps 150 reflowed to make electrical and mechanical connection to conductive layer 122 in interconnect substrate 120.

Figure 5C:
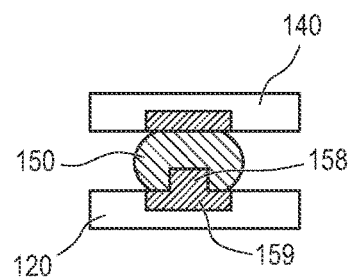
Figure 5D:
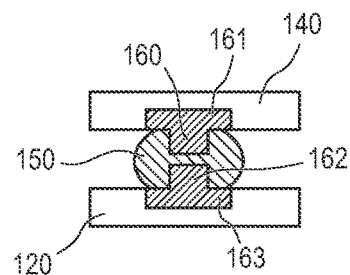
Figure 5E:
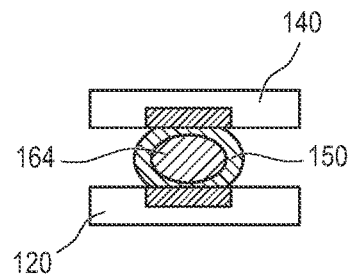

FIG. 5c shows another embodiment for bump 150 with stud 158 extending from contact pad 159 on substrate 120. FIG. 5d shows another embodiment for bump 150 with stud 160 extending from contact pad 161 on substrate 140 and stud 162 extending from contact pad 163 on substrate 120. FIG. 5e shows another embodiment for bump 150 with internal core Cu ball 164.

Figure 5F:
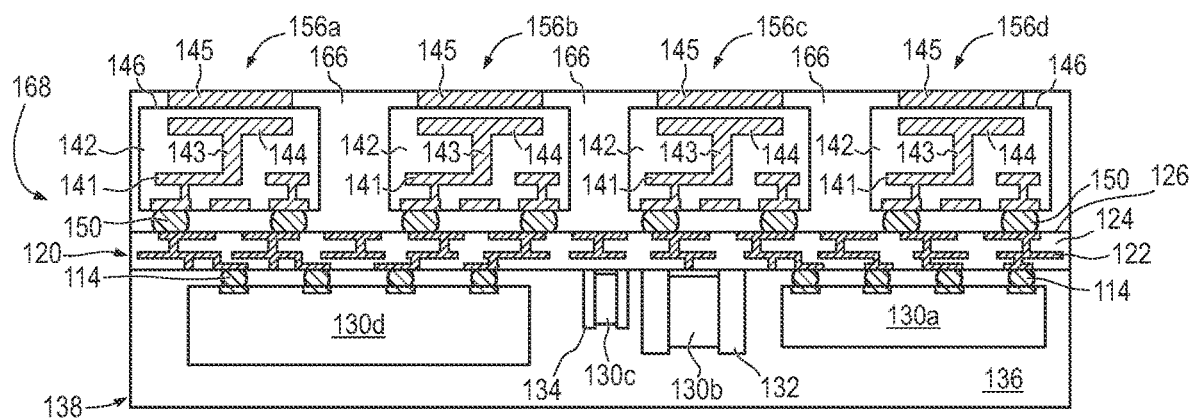

In FIG. 5f, an encapsulant or molding compound 166 is deposited over and around discrete antenna modules 156 and substrate 120 using a paste printing, compressive molding, transfer molding, liquid encapsulant molding, vacuum lamination, spin coating, or other suitable applicator. Encapsulant 166 can be polymer composite material, such as epoxy resin with filler, epoxy acrylate with filler, or polymer with proper filler. Encapsulant 166 is non-conductive, provides structural support, and environmentally protects the semiconductor device from external elements and contaminants.

Electronic component assembly 138 in SIP 168 includes RF circuits that transmit and receive RF signals, i.e., perform RF communications. Discrete antenna modules 156a-156d are individually mounted to electronic component assembly 138 and electrically connected to one or more of electronic components 130a-130d to enable transmission and reception of the RF signals with respect to the electronic components. For example, an RF signal generated by electronic component 130a is routed through conductive layer 122 and further through portions of conductive layer 141 to transmission out one or more of discrete antenna modules 156a-156d. In a similar manner, an RF signal received by one or more of discrete antenna modules 156a-156d is routed through conductive layers 141 and 122 to electronic component 130a.

Figure 6:
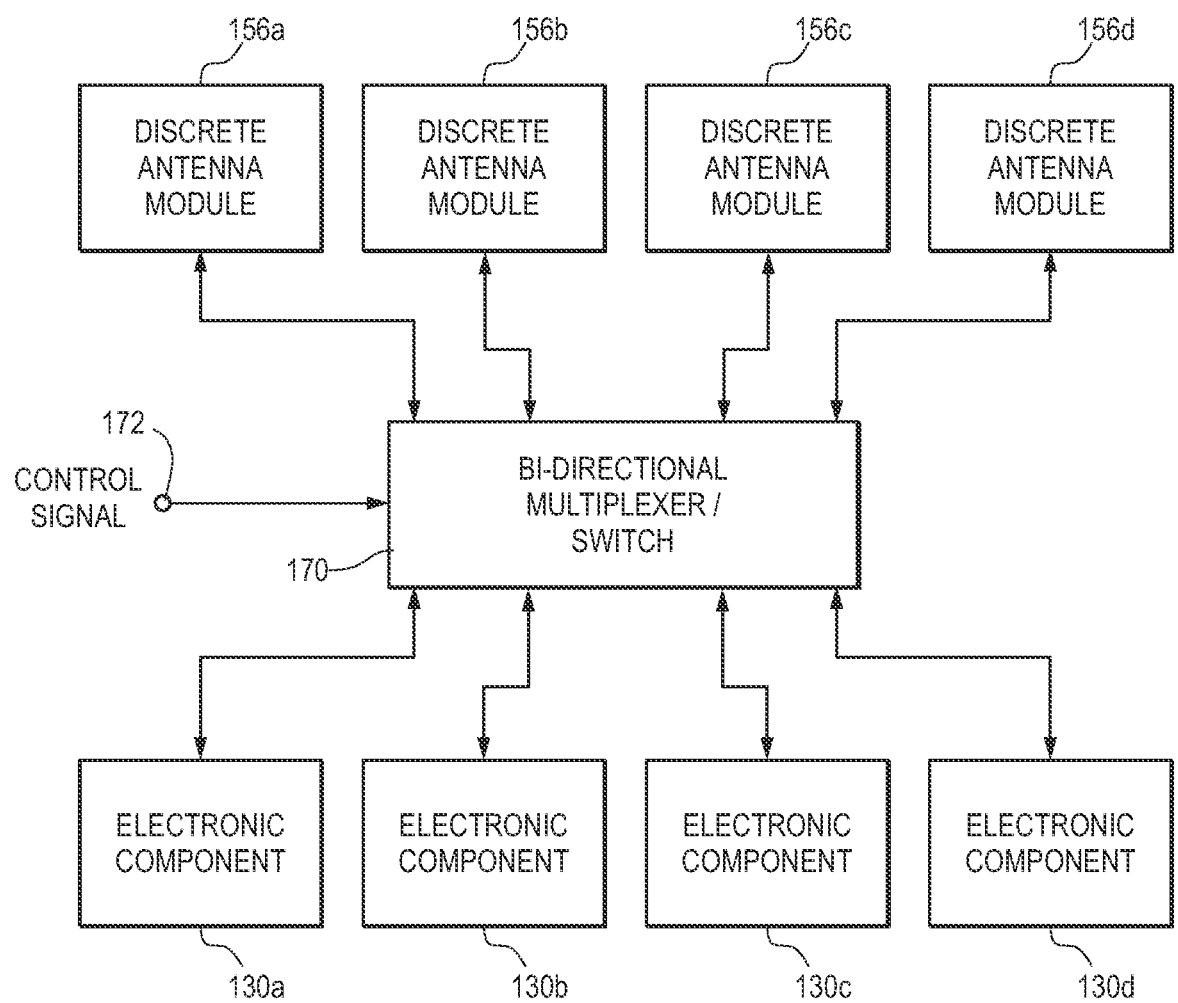
FIG. 6 illustrates a bi-directional multiplexer/switch connecting the discrete antenna modules to the electronic components.

FIG. 6 illustrates an exemplary configuration for routing an RF signal between one or more discrete antenna modules 156a-156d and one or more electronic components 130a-130d. Discrete antenna modules 156a-156d are coupled to terminals of bi-directional multiplexer/switch 170. Electronic components 130a-130d are also coupled to terminals of bi-directional multiplexer/switch 170. The control signal at terminal 172 controls the operation of bi-directional multiplexer/switch 170. Bi-directional multiplexer/switch 170 can be disposed on substrate 120.

In one embodiment, while four discrete antenna modules 156a-156d are mounted to electronic component assembly 138, only one discrete antenna module is enabled for transmission and reception of the RF signals, i.e., perform RF communications. The remaining discrete antenna modules are kept in standby or disabled as spares. In one example, during manufacturing test of SIP 168, the control signal from the test unit enables transmissions from discrete antenna module 156a through bi-directional multiplexer/switch 170 and disables or places in standby discrete antenna modules 156b-156d. If the functional test is passed, then discrete antenna module 156a is retained as the operational antenna. If discrete antenna module 156a fails functional testing or physical inspection, then the control signal from the test unit enables transmissions from discrete antenna module 156b through bi-directional multiplexer/switch 170 and disables or places in standby discrete antenna modules 156a, 156c, and 156d. The functional test is repeated. If the functional test is passed, then discrete antenna module 156b is retained as the operational antenna. If discrete antenna module 156b fails functional testing or physical inspection, then the control signal from the test unit enables transmissions from discrete antenna module 156c through bi-directional multiplexer/switch 170 and disables or places in standby discrete antenna modules 156a, 156b, and 156d. The functional test is repeated. If the functional test is passed, then discrete antenna module 156c is retained as the operational antenna. If discrete antenna module 156c fails functional testing or physical inspection, then the control signal from the test unit enables transmissions from discrete antenna module 156d through bi-directional multiplexer/switch 170 and disables or places in standby discrete antenna modules 156a-156c. The functional test is repeated. If the functional test is passed, then discrete antenna module 156d is retained as the operational antenna. If all four discrete antenna modules 156a-156d fail, then SIP 168 is rejected.

Figure 7:
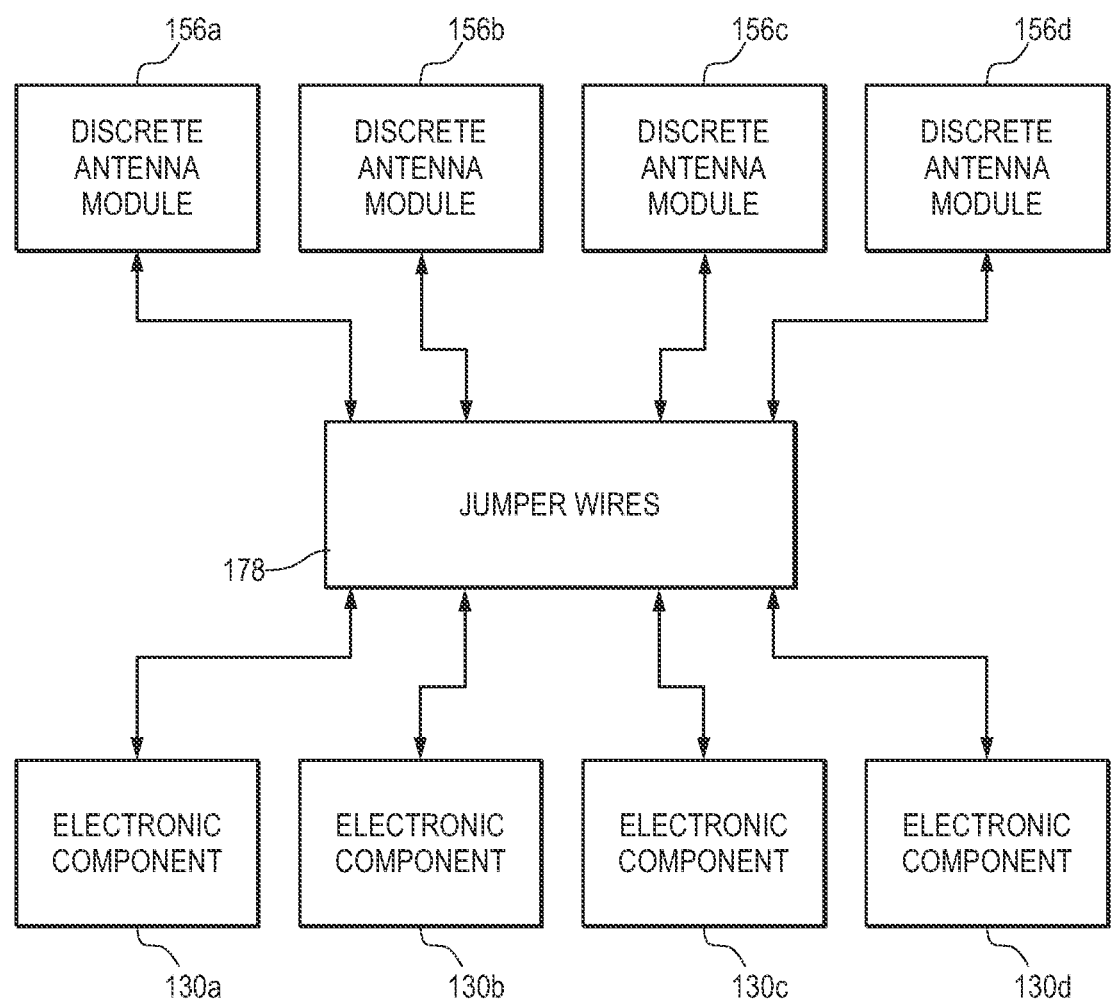
FIG. 7 illustrates a jumper wire connecting the discrete antenna modules to the electronic components.

In another embodiment, one or more discrete antenna modules 156a-156d are connected to one or more electronic components 130a-130d with one or more jumper wires 178, as shown in FIG. 7. For example, jumper wire 178 may connect discrete antenna module 156a to electronic components 130a-130d for RF communications. Alternatively, jumper wire 178 may connect discrete antenna module 156b to electronic components 130a-130d, or jumper wire 178 may connect antenna module 156c to electronic components 130a-130d, or jumper wire 178 may connect discrete antenna module 156d to electronic components 130a-130d, for RF communications.

SIP 168 provides multiple opportunities to switch between the available discrete antenna modules to pass functional testing. Discrete antenna modules 156a-156d reduce manufacturing cost by providing spare antenna modules to use as needed.

In another example, SIP 168 may fail in the field. Assume discrete antenna module 156a is enabled during manufacturing but later fails during field use or test. The control signal for bi-directional multiplexer/switch 170 can be generated from a microprocessor or dip switch mounted to the PCB. Since discrete antenna module 156a is non-functional, the control signal enables transmissions from discrete antenna module 156b through bi-directional multiplexer/switch 170 and disables or places in standby discrete antenna modules 156a, 156c, and 156d. The field test is repeated. If the field test is passed, then discrete antenna module 156b is retained as the operational antenna. If discrete antenna module 156b fails the field test, then the control signal enables transmissions from discrete antenna module 156c through bi-directional multiplexer/switch 170 and disables or places in standby discrete antenna modules 156a, 156b, and 156d. The field test is repeated. If the field test is passed, then discrete antenna module 156c is retained as the operational antenna. If discrete antenna module 156c fails the field testing, then the control signal enables transmissions from discrete antenna module 156d through bi-directional multiplexer/switch 170 and disables or places in standby discrete antenna modules 156a-156c. The field test is repeated. If the field test is passed, then discrete antenna module 156d is retained as the operational antenna. If all four discrete antenna modules 156a-156d fail, then SIP 168 is determined to be defective.

Figure 8A:
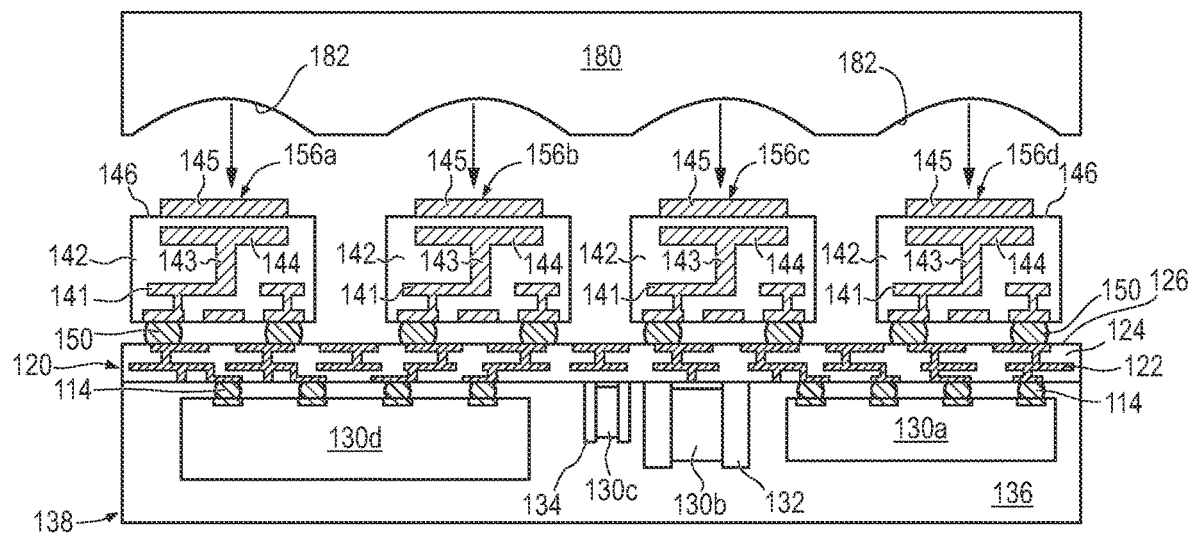
FIGS. 8a-8c illustrate a process of forming bumps over the discrete antenna modules to enhance RF communications.
Figure 8B:
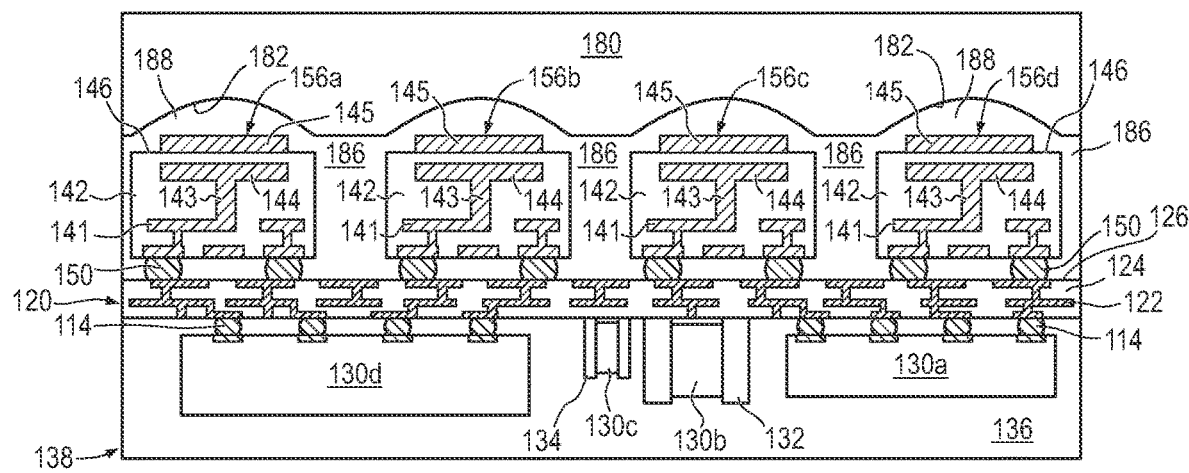
Figure 8C:
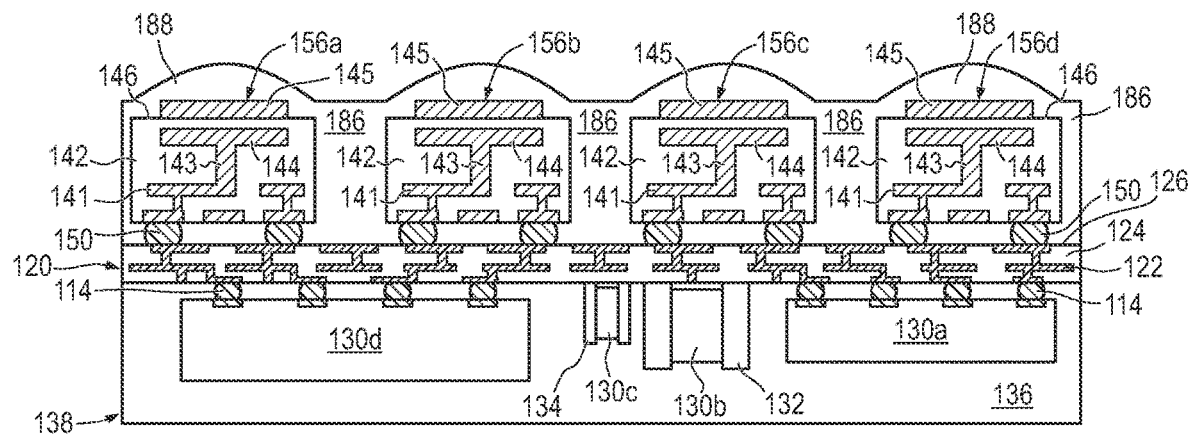

In another embodiment, continuing from FIG. 5b, chase mold 180 is disposed over discrete antenna modules 156a-156d as mounted to electronic component assembly 138, as shown in FIG. 8a. Chase mold 180 includes curved indentations 182 aligned with a top surface of each of the discrete antenna modules 156a-156d. As the encapsulant or molding compound is injected into chase mold 180, encapsulant 186 fills the areas over and around discrete antenna modules 156a-156d and forms bumps 188 over discrete antenna modules 156a-156d, as shown in FIG. 8b. FIG. 8c shows encapsulant 186 and bumps 188 after chase mold 180 is removed. Encapsulant 186 and bumps 188 can be polymer composite material, such as epoxy resin with filler, epoxy acrylate with filler, or polymer with proper filler. Alternatively, bumps 188 may contain a dielectric material having a high dielectric constant $D_K$, such as ajinomoto build-up film, pre-preg, glass, ceramic, silicon, copper clad laminate, quartz, and Teflon. Encapsulant 186 is non-conductive, provides structural support, and environmentally protects the semiconductor device from external elements and contaminants. Bumps 188 can have a variety of shapes, including trapezium, diamond, hemisphere, semi-elliptical, or lens shape, to optimize refraction/diffraction/reflection characteristics of the RF signal to improve a transmission and reception rate or a gain of antenna 144 and patch antenna 145. Bumps 188 increase the transmission and reception area of the corresponding antenna. Bumps 188 reduce the height of the antenna structure, as compared to the single antenna discussed in the background, allowing the package to be miniaturized while having a high level of antenna performance.

Figure 9A:
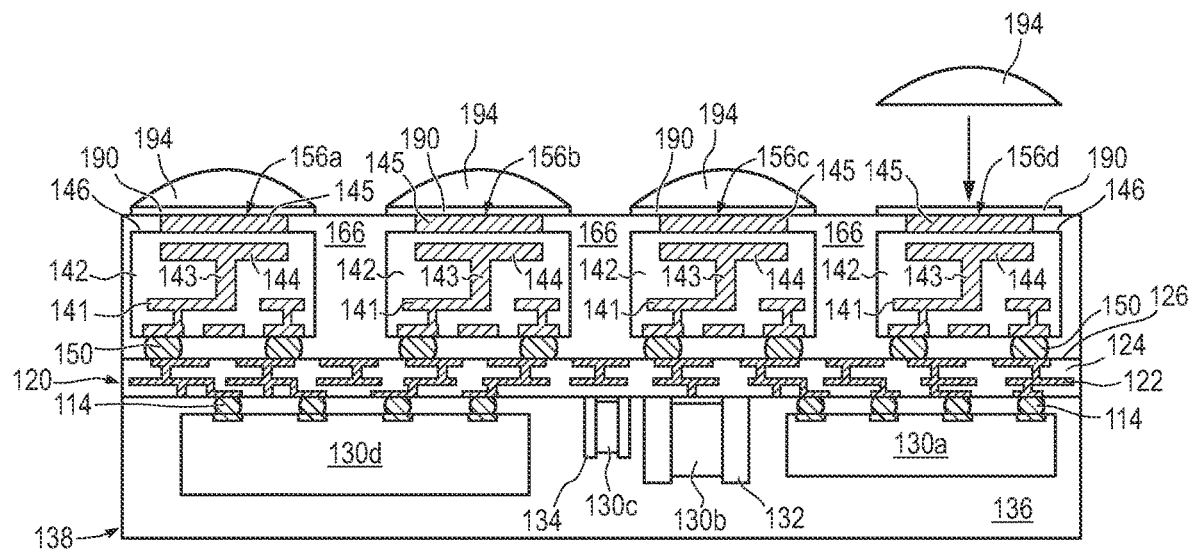
FIGS. 9a-9b illustrate another process of forming bumps over the discrete antenna modules to enhance RF communications.
Figure 9B:
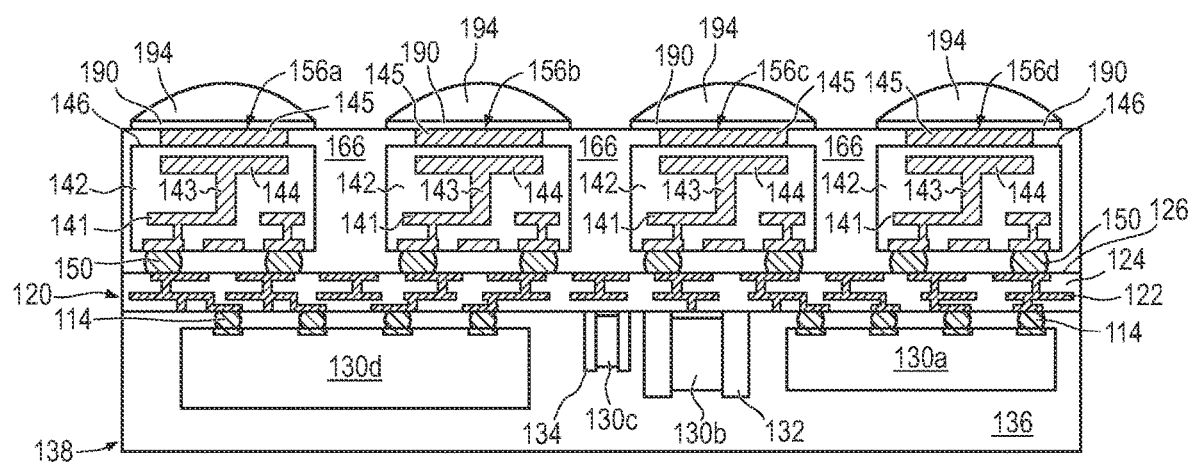

In another embodiment, continuing from FIG. 5f, adhesive material 190 is disposed on surface 192 of encapsulant 166 over discrete antenna modules 156a-156d, as mounted to electronic component assembly 138, as shown in FIG. 9a. Individual bumps 194 are affixed to adhesive material 190 over each of discrete antenna modules 156a-156d and shown in FIG. 9b. Bumps 194 can be polymer composite material, such as epoxy resin with filler, epoxy acrylate with filler, or polymer with proper filler. Alternatively, bumps 194 may contain a dielectric material having a high dielectric constant $D_K$, such as ajinomoto build-up film, pre-preg, glass, ceramic, silicon, copper clad laminate, quartz, and Teflon. Bumps 194 can have a variety of shapes, including trapezium, diamond, hemisphere, semi-elliptical, or lens shape, to optimize refraction/diffraction/reflection characteristics of the RF signal to improve a transmission and reception rate or a gain of antenna 144 and patch antenna 145. Bumps 194 increase the transmission and reception area of the corresponding antenna. Bumps 194 reduce the height of the antenna structure, as compared to the single antenna discussed in the background, allowing the package to be miniaturized while having a high level of antenna performance.

Figure 10A:
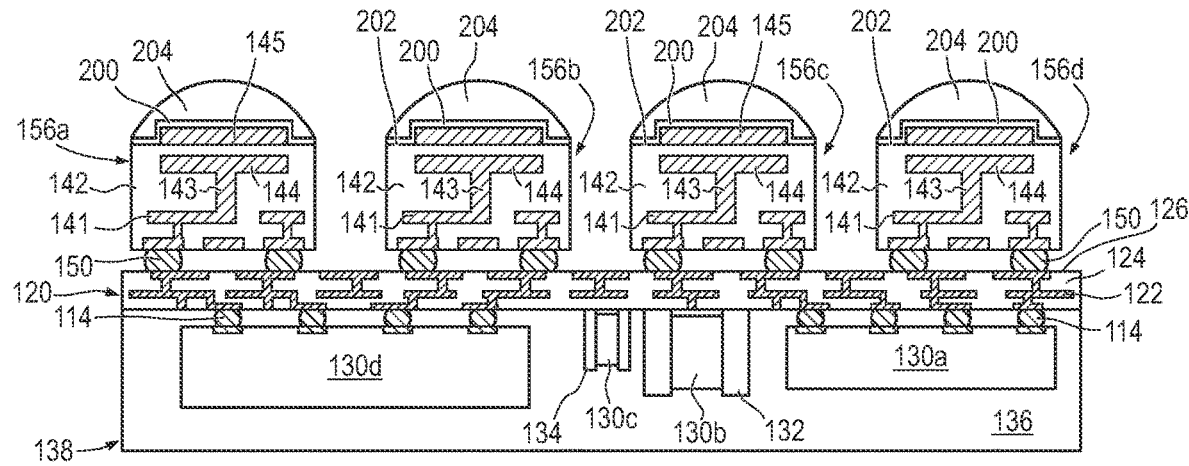
FIGS. 10a-10b illustrate another process of forming bumps over the discrete antenna modules to enhance RF communications.

In another embodiment, continuing from FIG. 5b, adhesive material 200 is disposed on surface 202 and patch antenna 145 of discrete antenna modules 156a-156d, as mounted to electronic component assembly 138 and shown in FIG. 10a. Individual bumps 204 are affixed to adhesive material 200 over each of discrete antenna modules 156a-156d. Bumps 204 can be polymer composite material, such as epoxy resin with filler, epoxy acrylate with filler, or polymer with proper filler. Alternatively, bumps 204 may contain a dielectric material having a high dielectric constant $D_K$, such as ajinomoto build-up film, pre-preg, glass, ceramic, silicon, copper clad laminate, quartz, and Teflon. Bumps 204 can have a variety of shapes, including trapezium, diamond, hemisphere, semi-elliptical, or lens shape, to optimize refraction/diffraction/reflection characteristics of the RF signal to improve a transmission and reception rate or a gain of antenna 144 and patch antenna 145. Bumps 204 increase the transmission and reception area of the corresponding antenna. Bumps 204 reduce the height of the antenna structure, as compared to the single antenna discussed in the background, allowing the package to be miniaturized while having a high level of antenna performance.

Figure 10B:
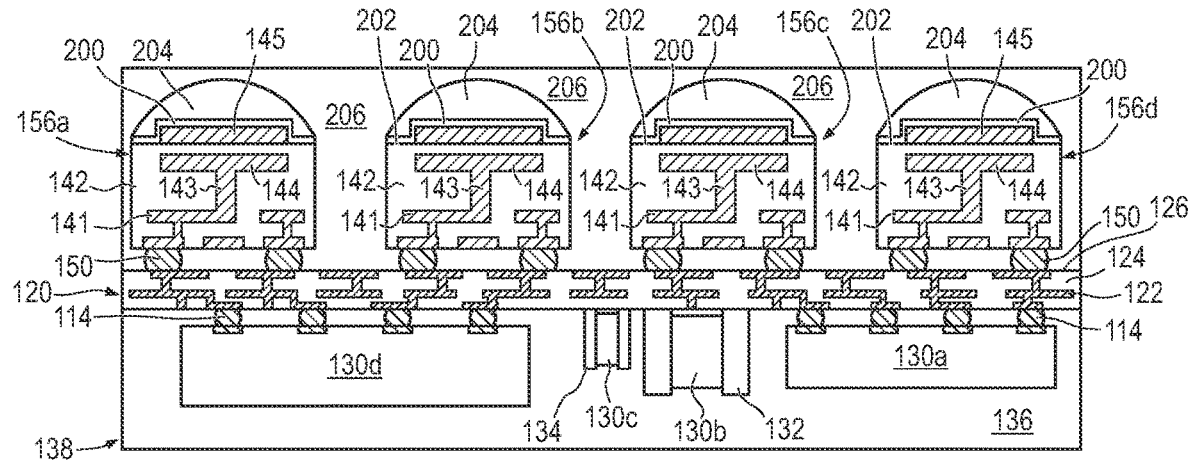

In FIG. 10b, an encapsulant or molding compound 206 is deposited over and around discrete antenna modules 156, bumps 206, and substrate 120 using a paste printing, compressive molding, transfer molding, liquid encapsulant molding, vacuum lamination, spin coating, or other suitable applicator. Encapsulant 206 can be polymer composite material, such as epoxy resin with filler, epoxy acrylate with filler, or polymer with proper filler. Encapsulant 206 is non-conductive, provides structural support, and environmentally protects the semiconductor device from external elements and contaminants.

Figure 11:
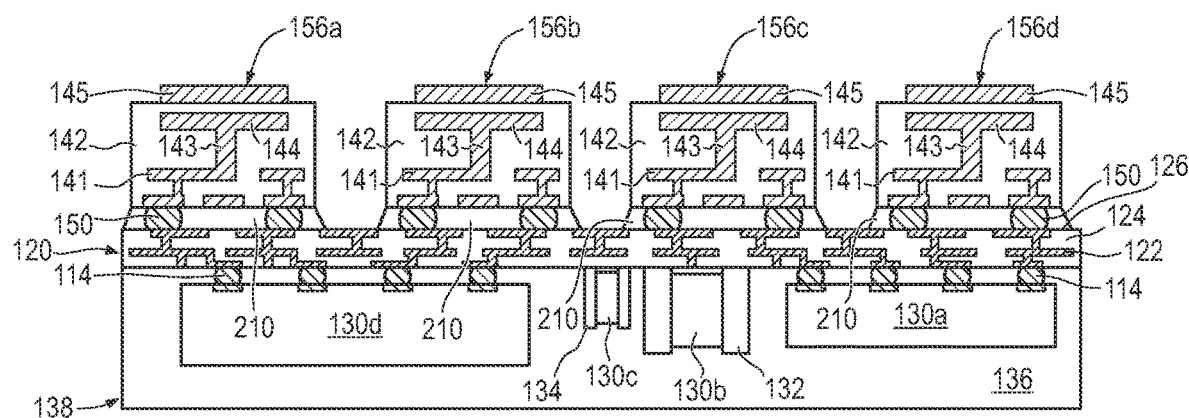
FIG. 11 illustrates underfill material under the discrete antenna modules.

In another embodiment, continuing from FIG. 5b, an underfill material 210, such as an epoxy resin, is deposited under discrete antenna modules 156a-156d, as mounted to electronic component assembly 138 and shown in FIG. 11.

Figure 12A:
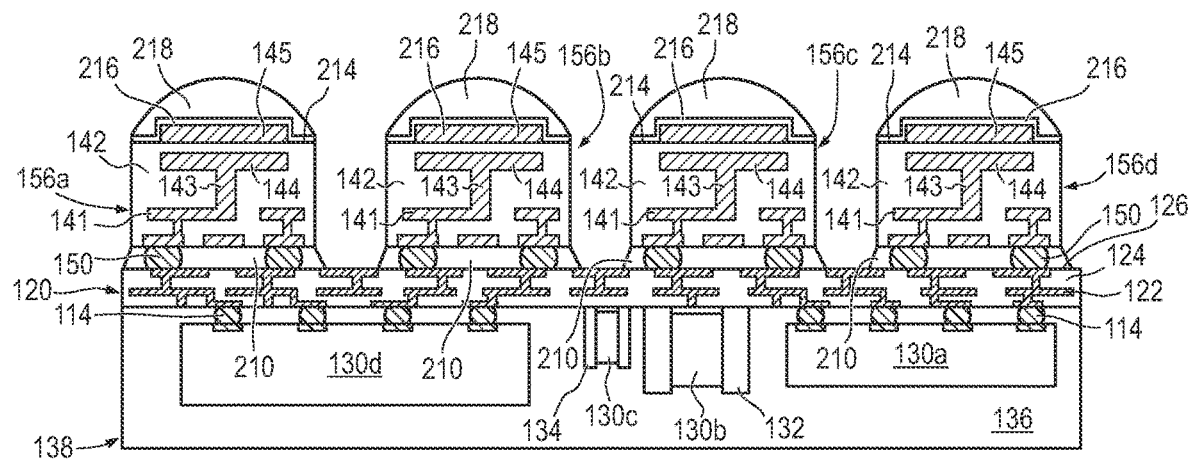
FIGS. 12a-12b illustrate underfill material under the discrete antenna modules and bumps over the discrete antenna modules to enhance RF communications.

FIG. 12a shows underfill material 210 under discrete antenna modules 156a-156d, as well as adhesive layer 216 and bumps 218 formed over surface 214 and patch antenna 145 of discrete antenna modules 156a-156d, similar to FIG. 10a.

Figure 12B:
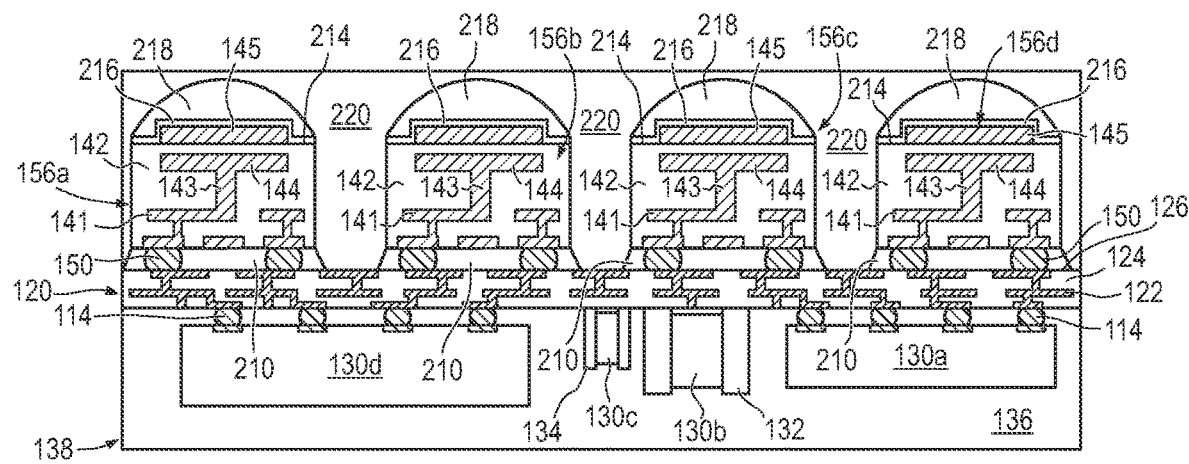

In FIG. 12b, an encapsulant or molding compound 220 is deposited over and around discrete antenna modules 156, bumps 218, and substrate 120 using a paste printing, compressive molding, transfer molding, liquid encapsulant molding, vacuum lamination, spin coating, or other suitable applicator. Encapsulant 220 can be polymer composite material, such as epoxy resin with filler, epoxy acrylate with filler, or polymer with proper filler. Encapsulant 220 is non-conductive, provides structural support, and environmentally protects the semiconductor device from external elements and contaminants.

Electrical components 130a-130d may contain IPDs that are susceptible to or generate EMI, RFI, harmonic distortion, and inter-device interference. For example, the IPDs contained within electrical components 130a-130d provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130d contain digital circuits switching at a high frequency, which could interfere with the operation of IPDs in the SIP module.

Figure 13:
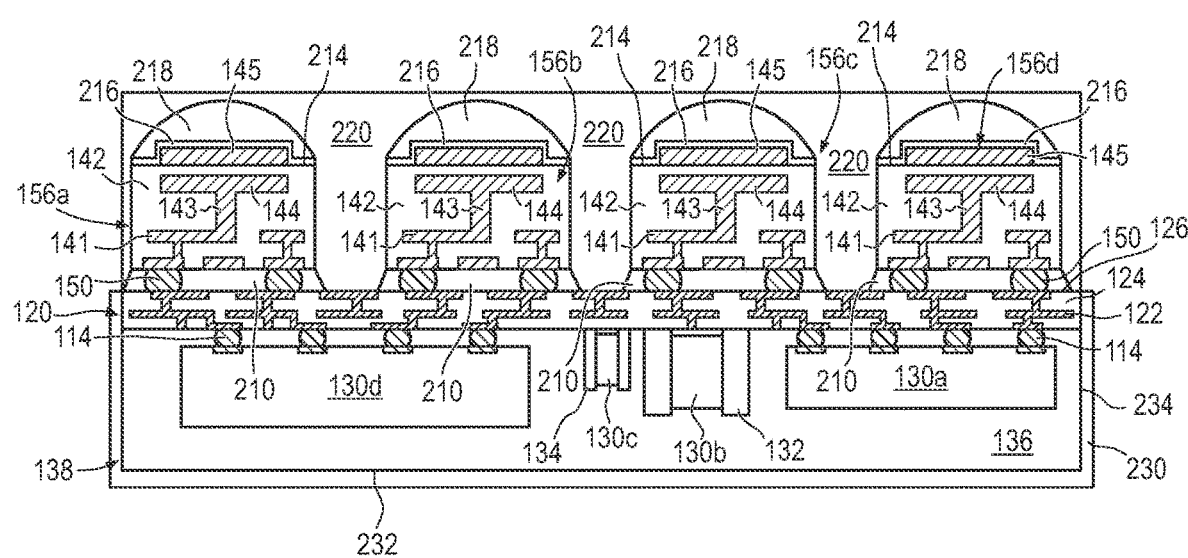
FIG. 13 illustrates an EMI shielding layer over the SIP.

Continuing from FIG. 12b, an electromagnetic shielding layer 230 is formed or disposed over surface 232 of encapsulant 136, as shown in FIG. 13. Shielding layer 230 can be one or more layers of Al, Cu, Sn, Ni, Au, Ag, or other suitable conductive material. Alternatively, shielding layer 230 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. In addition, shielding layer 230 covers side surfaces 234 of encapsulant 136.

Figure 14:
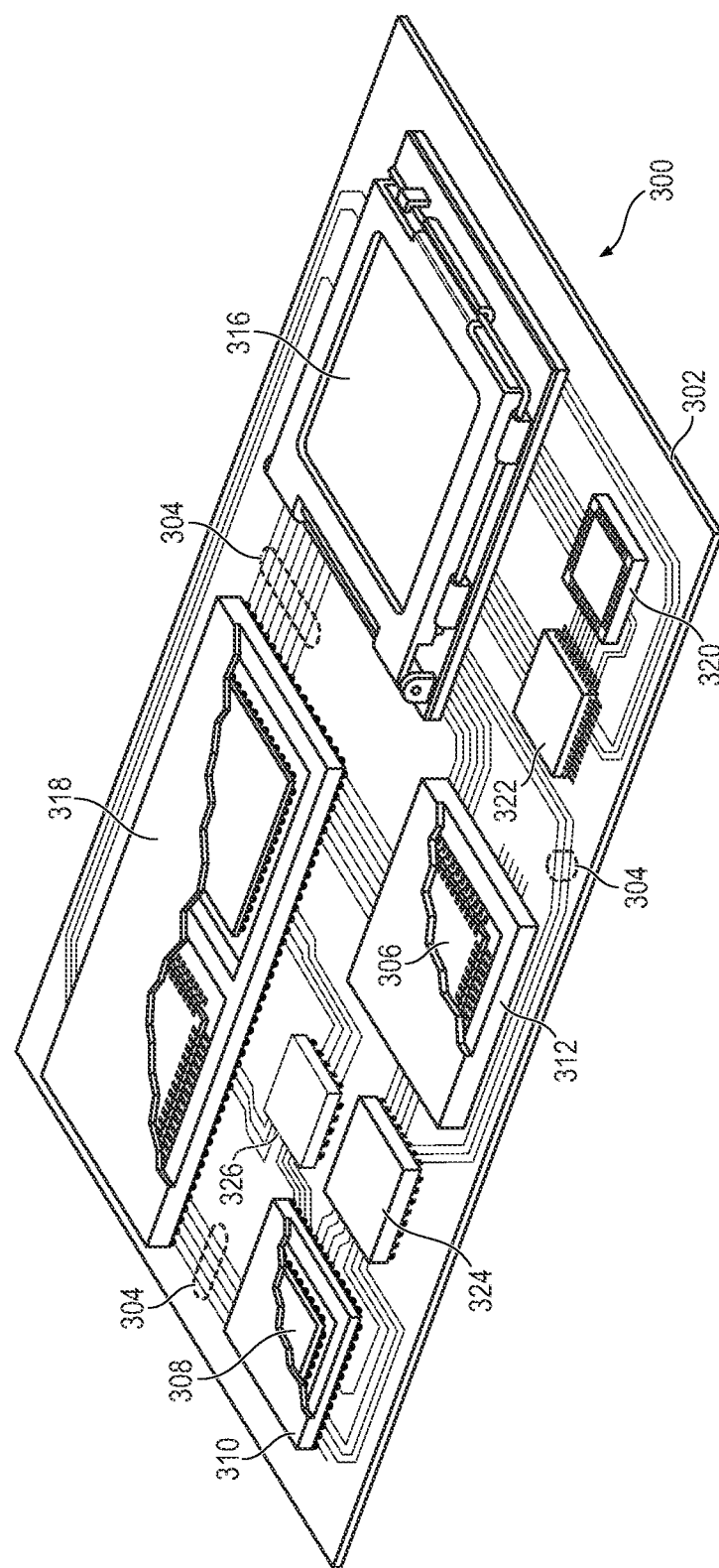
FIG. 14 illustrates a printed circuit board (PCB) with different types of packages mounted to a surface of the PCB.

FIG. 14 illustrates electronic device 300 having a chip carrier substrate or PCB 302 with a plurality of semiconductor packages mounted on a surface of PCB 302, including SIP module 168. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 14, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing an electronic component assembly;
    disposing a plurality of discrete antenna modules over the electronic component assembly, wherein each discrete antenna module is capable of providing radio frequency (RF) communication for the electronic component assembly;
    depositing an encapsulant around the discrete antenna modules; and
    enabling RF communication between a first one of the discrete antenna modules and the electronic component assembly, while disabling RF communication between a second one of the discrete antenna modules and the electronic component assembly.

2. The method of claim 1, further including enabling RF communication between the second one of the discrete antenna modules and the electronic component assembly, while disabling RF communication between the first one of the discrete antenna modules and the electronic component assembly.

3. The method of claim 1, further including forming a bump over the discrete antenna modules.

4. The method of claim 1, further including forming a shielding layer over the electronic components assembly.

5. A method of making a semiconductor device, comprising:
    providing an electronic component assembly;
    disposing a plurality of discrete antenna modules over the electronic component assembly;
    depositing an encapsulant around the discrete antenna modules; and
    enabling radio frequency (RF) communication between a first one of the discrete antenna modules and the electronic component assembly, while disabling RF communication between a second one of the discrete antenna modules and the electronic component assembly.

6. The method of claim 5, further including forming a bump over the discrete antenna modules.

7. The method of claim 5, further including forming a shielding layer over the electronic components assembly.

8. The method of claim 5, further including disposing a stud or core ball internal to a bump connecting the discrete antenna modules to the electronic component assembly.

9. A method of making a semiconductor device, comprising:
   providing an electronic component assembly;
   disposing a plurality of discrete antenna modules over the electronic component assembly; and
   depositing an encapsulant over and around the discrete antenna modules, wherein the encapsulant includes a bump over the discrete antenna modules.

10. A semiconductor device, comprising:
    an electronic component assembly;
    a plurality of discrete antenna modules disposed over the electronic component assembly, wherein each discrete antenna module provides radio frequency (RF) communication for the electronic component assembly;
    an encapsulant deposited around the discrete antenna modules; and
    a switching circuit to disable RF communication between at least one of the discrete antenna modules and the electronic component assembly.

11. The semiconductor device of claim 10, wherein the switching circuit enables RF communication between at least one of the discrete antenna modules and the electronic component assembly.

12. The semiconductor device of claim 10, further including a bump formed over the discrete antenna modules.

13. The semiconductor device of claim 10, further including a shielding layer formed over the electronic components assembly.

14. A semiconductor device, comprising:
    an electronic component assembly;
    a plurality of discrete antenna modules disposed over the electronic component assembly;
    an encapsulant deposited over the discrete antenna modules; and
    a switching circuit disabling RF communication between at least one of the discrete antenna modules and the electronic component assembly.

15. The semiconductor device of claim 14, further including a bump formed over the discrete antenna modules.

16. The semiconductor device of claim 14, further including a shielding layer formed over the electronic components assembly.

17. A semiconductor device, comprising:
    an electronic component assembly;
    a plurality of discrete antenna modules disposed over the electronic component assembly; and
    an encapsulant material deposited over the discrete antenna modules, wherein the encapsulant material includes a curved bump shape over the discrete antenna modules.

* * * * *